(12) United States Patent
Park et al.

(10) Patent No.: US 8,148,894 B2
(45) Date of Patent: Apr. 3, 2012

(54) ORGANIC LIGHT EMITTING DIODE DISPLAY

(75) Inventors: Soon-Ryong Park, Yongin (KR);
Woo-Suk Jung, Yongin (KR);
Hee-Seong Jeong, Yongin (KR);
Hee-Chul Jeon, Yongin (KR);
Chul-Woo Jeong, Yongin (KR);
Jae-Yong Kim, Yongin (KR); Eun-Ah Kim, Yongin (KR); Noh-Min Kwak, Yongin (KR); Joo-Hwa Lee, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 260 days.

(21) Appl. No.: 12/536,315

(22) Filed: Aug. 5, 2009

(65) Prior Publication Data
US 2010/0156282 A1    Jun. 24, 2010

(30) Foreign Application Priority Data

Aug. 27, 2008  (KR) .................. 10-2008-0083913

(51) Int. Cl.
*H05B 33/12* (2006.01)
(52) U.S. Cl. ....................................... 313/504; 313/507
(58) Field of Classification Search .......... 313/498–512; 315/169.3; 345/36, 45, 76
See application file for complete search history.

(56) References Cited

U.S. PATENT DOCUMENTS

| 6,118,504 | A | 9/2000 | Iijima et al. |
| 6,169,708 | B1 | 1/2001 | Kaneko et al. |
| 6,297,864 | B1 | 10/2001 | Kaneko et al. |
| 6,417,892 | B1 * | 7/2002 | Sharp et al. .................... 348/742 |
| 6,552,767 | B1 * | 4/2003 | Kaneko ......................... 349/119 |
| 6,624,936 | B2 | 9/2003 | Kotchick et al. |
| 6,667,784 | B2 * | 12/2003 | Sharp et al. ...................... 349/78 |
| 6,774,962 | B2 | 8/2004 | Yoon |
| 6,787,976 | B2 | 9/2004 | Minoura et al. |
| 6,841,803 | B2 | 1/2005 | Aizawa et al. |
| 6,898,018 | B2 | 5/2005 | Minoura et al. |
| 2002/0043931 | A1 | 4/2002 | Minoura et al. |
| 2002/0122235 | A1 | 9/2002 | Kurtz et al. |

(Continued)

FOREIGN PATENT DOCUMENTS

EP            0588504 A1      3/1994

(Continued)

OTHER PUBLICATIONS

European search report for European patent application No. 09166447.4-2203 dated Nov. 24, 2009 by European Patent Office.

(Continued)

*Primary Examiner* — Nimeshkumar Patel
*Assistant Examiner* — Christopher Raabe
(74) *Attorney, Agent, or Firm* — Knobbe, Martens, Olson & Bear LLP

(57) ABSTRACT

The present invention relates to an OLED display. In some embodiments, the OLED display may employ combinations of linear polarization, circular or elliptical polarization, and phase delay in order to suppress reflection from external light while minimizing the loss of emitted light from the OLED display. For example, the OLED in the display includes a stack having a first electrode, an organic emission layer, and a second electrode, a DBEF formed on the OLED, a first polarizing plate formed on the DBEF, a second polarizing plate formed on the first polarizing plate, and a plurality of phase delay plates formed between the first polarizing plate and the second polarizing plate.

17 Claims, 11 Drawing Sheets

U.S. PATENT DOCUMENTS

| | | | |
|---|---|---|---|
| 2002/0145689 A1* | 10/2002 | Kaneko | 349/114 |
| 2003/0127656 A1 | 7/2003 | Aizawa et al. | |
| 2004/0051445 A1 | 3/2004 | Adachi | |
| 2004/0189167 A1 | 9/2004 | Adachi et al. | |
| 2004/0227698 A1* | 11/2004 | Yamazaki et al. | 345/32 |
| 2005/0035353 A1* | 2/2005 | Adachi et al. | 257/72 |
| 2005/0127820 A1* | 6/2005 | Yamazaki et al. | 313/501 |
| 2005/0151896 A1* | 7/2005 | Hara et al. | 349/96 |
| 2006/0145600 A1 | 7/2006 | Yu et al. | |
| 2006/0187384 A1 | 8/2006 | Hisatake | |
| 2006/0291238 A1* | 12/2006 | Epstein et al. | 362/600 |
| 2007/0024777 A1 | 2/2007 | Sawayama et al. | |
| 2007/0085476 A1 | 4/2007 | Hirakata et al. | |
| 2007/0145889 A1 | 6/2007 | Tamura et al. | |
| 2007/0230211 A1 | 10/2007 | Osato et al. | |
| 2008/0123321 A1 | 5/2008 | Hsu et al. | |
| 2008/0144177 A1 | 6/2008 | Miller | |
| 2009/0290079 A1 | 11/2009 | Evans et al. | |

FOREIGN PATENT DOCUMENTS

| | | |
|---|---|---|
| EP | 0969296 A2 | 1/2000 |
| GB | 2437553 A | 10/2007 |
| JP | 06-109925 A | 4/1994 |
| JP | 06-235914 | 8/1994 |
| JP | 07-205322 (A) | 8/1995 |
| JP | 2001-357979 | 12/2001 |
| JP | 2002-198184 | 7/2002 |
| JP | 2003-121835 | 4/2003 |
| JP | 2003-186413 | 7/2003 |
| JP | 2003-186413 A | 7/2003 |
| JP | 2003-279988 (A) | 10/2003 |
| JP | 2003-315548 A | 11/2003 |
| JP | 2004-030955 A | 1/2004 |
| JP | 2004-070094 A | 3/2004 |
| JP | 2004-086145 | 3/2004 |
| JP | 2004-219825 A | 8/2004 |
| JP | 2004-296162 | 10/2004 |
| JP | 2004-296162 A | 10/2004 |
| JP | 2004-361774 A | 12/2004 |
| JP | 2005-108540 | 4/2005 |
| JP | 2006-343553 | 12/2006 |
| JP | 2006-343553 A | 12/2006 |
| JP | 2007-041536 (A) | 2/2007 |
| JP | 2007-141824 (A) | 6/2007 |
| KR | 10-2002-0003428 A | 1/2002 |
| KR | 2003-0038037 | 5/2003 |
| KR | 10-2003-0077402 A | 10/2003 |
| KR | 10-0454748 | 10/2004 |
| KR | 10-2005-0018401 A | 2/2005 |
| KR | 10-2005-0020332 A | 3/2005 |
| KR | 10-2005-0026863 A | 3/2005 |
| KR | 10-2005-0071387 A | 7/2005 |
| KR | 10-2005-0106004 A | 11/2005 |
| KR | 10-2006-0065729 A | 6/2006 |
| KR | 10-0606778 | 8/2006 |
| KR | 10-0706730 | 4/2007 |
| KR | 10-0714015 | 4/2007 |
| KR | 10-2007-0095826 A | 10/2007 |
| KR | 10-2008-0061791 A | 7/2008 |
| KR | 10-2008-0076384 A | 8/2008 |

OTHER PUBLICATIONS

European search report for European patent application No. 09166444.1-1235 dated Nov. 23, 2009 by European Patent Office.

The Extended European Search Report for European patent application No. 09168087.6-2203 dated Dec. 2, 2009 by European Patent Office.

Office Action dated Mar. 22, 2011 in related U.S. Appl. No. 12/508,426, filed Jul. 23, 2009.

Office Action dated Apr. 4, 2011 in related U.S. Appl. No. 12/508,409, filed Jul. 23, 2009.

Japanese Notice of Allowance dated Jan. 24, 2012 for Japanese Patent Application No. JP 2009-097936 which shares priority of Korean Patent Application No. KR 10-2009-0009364 with U.S. Appl. No. 12/508,438, filed Jul. 23, 2009, which is related to captioned U.S. Appl. No. 12/536,315.

* cited by examiner

ORGANIC LIGHT EMITTING DIODE DISPLAY

CROSS-REFERENCE TO RELATED APPLICATIONS

This application claims priority to and the benefit of Korean Patent Application No. 10-2008-0083913 filed in the Korean Intellectual Property Office on Aug. 27, 2008, the entire contents of which are incorporated herein by reference.

BACKGROUND

1. Field of the Invention

The present invention relates to an organic light emitting diode (OLED) display. More particularly, it relates to an OLED display having improved display characteristics.

2. Description of the Related Art

An OLED display includes a plurality of organic light emitting diodes (OLEDs). OLEDs typically include hole injection electrodes, an organic light emission layer, and electron injection electrodes. Light is emitted when excitons are generated in the organic light emission layer. Excitons are generated as electrons and holes are combined drop from an excited state to a ground state. The OLED display displays an image by using the light resulting from these excitons.

Accordingly, the OLED display has self-luminance characteristics, and unlike a liquid crystal display (LCD), the thickness and weight thereof can be reduced since a separate light source is not required. Thus, OLED displays are used in various applications, such as displays in mobile electronic devices, because an OLED display has low power consumption, high luminance, and high reaction speed.

Unfortunately, one of the electrodes and other metal wires in the OLED display can reflect external light, such as ambient light. This reflected light can deteriorate the performance of the OLED display, especially when the OLED display is used in a bright setting. For example, the OLED display's expression of black color and contrast can be deteriorated due to reflections of external light, thereby reducing visibility of the OLED display.

One known technique for solving this problem is the use of a polarizing plate and a phase delay plate. These plates are arranged on an OLED for suppressing reflection of external light. However, because light from the organic emission layer must pass through them, the polarizing plate and phase delay plate also reduce the light generated from the OLED and may decrease the performance and visibility of the OLED display device.

The above information disclosed in this Background section is only for enhancement of understanding. Therefore, it may contain information that does not form the prior art that is already known in this country to a person of ordinary skill in the art.

SUMMARY

Embodiments of the present invention provide an organic light emitting diode (OLED) display having advantages of improving visibility by suppressing reflection of external light and minimizing loss of light emitted from an organic emission layer of the OLED display. In addition, embodiments of the OLED display can reduce power consumption and may have increased life-span.

An exemplary OLED display according to an embodiment of the present invention includes an OLED formed by sequentially stacking a first electrode, an organic emission layer, and a second electrode, a dual brightness enhancement film (DBEF) formed on the OLED, a first polarizing plate formed on the DBEF, a second polarizing plate formed on the first polarizing plate, and a plurality of phase delay plates formed between the first polarizing plate and the second polarizing plate. The first polarizing plate and the DBEF may have the same polarizing axis. An angle of intersection between the polarizing axis of the first polarizing plate and a polarizing axis of the second polarizing plate may be about 45 degrees.

In an embodiment, the plurality of phase delay plates may include a first phase delay plate, a second phase delay plate, and a third phase delay plate. The first phase delay plate can be a ½ wavelength plate interposed between the first polarizing plate and the second polarizing plate. The second phase delay plate may be a ¼ wavelength plate interposed between the first polarizing plate and the first phase delay plate. And, the third phase delay plate may be a ¼ wavelength plate interposed between the first polarizing plate and the second phase delay plate.

An angle of intersection between the polarizing axis of the second polarizing plate and a light axis of the first phase delay plate may range from about 17.5 degrees to about 27.5 degrees.

An angle of intersection between the polarizing axis of the first polarizing plate and the light axis of the first phase delay plate may range from about 17.5 degrees to about 27.5 degrees.

An angle of intersection between the polarizing axis of the second polarizing plate and the light axis of the second phase delay plate may range from about 40 degrees to about 50 degrees.

An angle of intersection between the polarizing axis of the first polarizing plate and the light axis of the second phase delay plate may range from about 0 degrees to about 5 degrees.

An angle of intersection between the polarizing axis of the second polarizing plate and a light axis of the third phase delay plate may range from about 85 degrees to about 90 degrees.

An angle of intersection between the polarizing axis of the first polarizing plate and the light axis of the third phase delay plate may range from about 40 degrees to about 50 degrees.

An angle of intersection between the light axis of the second phase delay plate and the light axis of the third phase delay plate may be about 45 degrees.

In another embodiment, the plurality of phase delay plates may include a first phase delay and a second phase delay plate. The first phase delay plate can be a ½ wavelength plate interposed between the first polarizing plate and the second polarizing plate. The second phase delay plate can be a ¼ wavelength plate interposed between the first polarizing plate and the first phase delay plate.

An angle of intersection between the polarizing axis of the second polarizing plate and the light axis of the first phase delay plate may range from about 10 degrees to about 20 degrees.

An angle of intersection between the polarizing axis of the first polarizing plate and the light axis of the first phase delay plate may range from about 25 degrees to about 35 degrees.

An angle of intersection between the polarizing axis of the second polarizing plate and the light axis of the second phase delay plate may range from about 70 degrees to about 80 degrees.

An angle of intersection between the polarizing axis of the first polarizing plate and the light axis of the second phase delay plate may range from about 25 degrees to about 35 degrees.

In an embodiment, the OLED display may further include an additional phase delay plate interposed between the OLED and the DBEF. An angle of intersection between a light axis of the additional phase delay plate and the polarizing axis of the DBEF may range from about 40 degrees to about 50 degrees.

DETAILED DESCRIPTION OF SOME EMBODIMENTS

Figure 1:
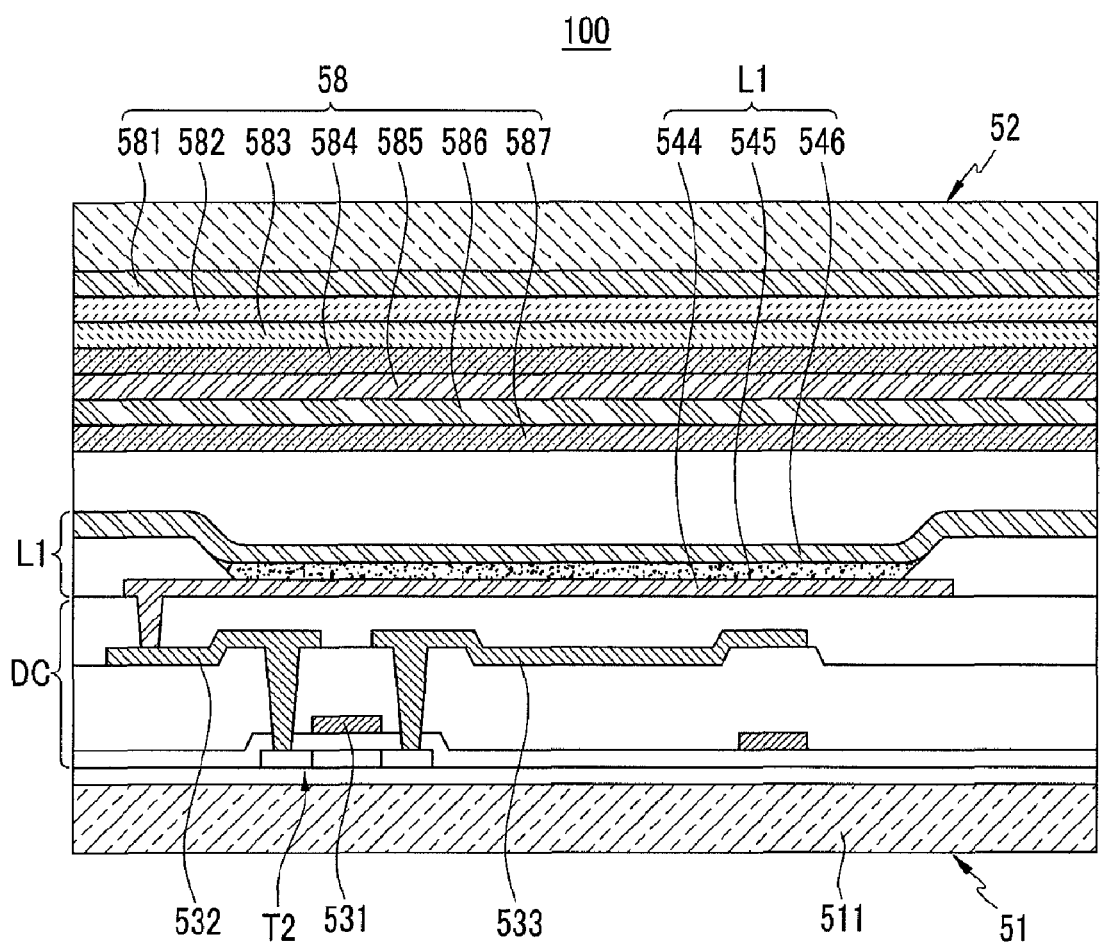
FIG. 1 is a cross-sectional view of an organic light emitting diode (OLED) display according to a first exemplary embodiment of the present invention.

The present invention will be described with reference to the accompanying drawings, in which exemplary embodiments of the invention are shown. As those skilled in the art will realize, the described embodiments may be modified in various different ways, all without departing from the spirit or scope of the present invention. Constituent elements having the same configuration are representatively described with reference to one or more embodiments. Other exemplary embodiments may then be described by referring to various differences between the embodiments.

The drawings and description are to be regarded as illustrative in nature and not restrictive. Like reference numerals designate like elements throughout the specification.

In the drawings, the thickness of layers, films, panels, regions, etc., are exaggerated for clarity. For example, it should be understood that when an element such as a layer, film, region, or substrate is referred to as being "on" another element, it can be directly on the other element or intervening elements may also be present. When an element is referred to as being "directly on" another element, there are no intervening elements present. In addition, the size and thickness of each element in the drawing are provided for better understanding and ease of description of various embodiments and are not intended to limit the present invention.

Exemplary embodiments of the present invention will now be described with reference to FIG. 1 and FIG. 2. Exemplary embodiments of an OLED display 100 may have improved visibility by efficiently suppressing the reflection of external light and minimizing the loss of light emitted out from its organic emission layer. In addition, the OLED display 100 can efficiently emit light generated from its organic emission layer to thereby reduce power consumption and increase its life-span. In some embodiments, the OLED display may employ combinations of linear polarization, circular or elliptical polarization, and phase delay in order to suppress reflection from external light while minimizing the loss of emitted light from the OLED display.

As shown in FIG. 1, an organic light emitting diode (OLED) display 100 includes a first substrate 51, a second substrate 52, and an optical member 58. The first and second substrates 51 and 52 are bonded to each other.

The first substrate 51 includes a substrate member 511, a driving circuit unit DC formed on the substrate member 511, and an OLED L1 formed on the driving circuit unit DC. The driving circuit unit DC is shown and described further with reference to FIG. 2.

In the driving circuit unit DC, the driving transistor T2 includes a gate electrode 531, a drain electrode 532, and a source electrode 533. The driving transistor T2 supplies an output current $I_{OLED}$ that is proportional to the square of a voltage difference between the voltage stored in the storage capacitor C1 (shown in FIG. 2) and a threshold voltage to the OLED L1. The OLED L1 then emits light based on the output current $I_{OELD}$.

The OLED L1 includes a first electrode 544, an organic emission layer 545 formed on the first electrode 544, and a second electrode 546 formed on the organic emission layer 545. The OLED L1 emits light toward the second electrode 546 from the organic emission layer 545, and the OLED display 100 displays an image based on this light. For purposes of illustration, the OLED display 100 is shown as a top light emitting type. However, other embodiments of the OLED display 100 may employ other emitting types.

In general, the first electrode 544 may serve as an anode and the second electrode 546 may serve as a cathode. However, other embodiments may use different configurations, For example, the first electrode 544 may serve as the cathode and the second electrode 546 may serve as the anode. The first electrode 544 of the OLED L1 is connected to the drain electrode 532 of the driving transistor T2. At least one of the first and second electrodes 544 and 546 is made to be transflective or reflective, and thus, reflects light.

The second substrate 52 covers the first substrate 51 on which the OLED L1 and the driving circuit unit DC are formed. For example, the second substrate 52 can be disposed facing the first substrate 51 and cover or protect the components of driving circuit unit DC (e.g., thin film transistors T1 and T2, and the capacitor C1), and the OLED L1 from the external environment.

The second substrate 52 can be bonded to the first substrate 110 by a sealing material (not shown). This sealing material may be formed along an edge of the second substrate 52 to seal a space between the substrates 51 and 52. The second substrate 52 may also cover the optical member 58 formed on the OLED L1.

However, the present invention is not limited to these configurations. For example, the optical member 58 can be formed on the second substrate 52. Thus, the optical member 58 can be disposed outside the sealed space between the first and second substrates 51 and 52. One skilled in the art will recognize that the location of the optical member 58 can be any location on the OLED L1.

The optical member 58 improves visibility of the OLED display 100 by suppressing reflection of external light and minimizes loss of light emitted out from the OLED L1. The optical member 58 includes a DBEF 586, a first polarizing plate 585, a second polarizing plate 581, and a plurality of phase delay plates 582, 583, and 584.

The DBEF 586 is disposed on the OLED L1. The first polarizing plate 585 is disposed on the DBEF 586, and the second polarizing plate 581 is disposed on the first polarizing plate 585.

The plurality of delay plates 582, 583, and 584 are interposed between the first polarizing plate 585 and the second polarizing plate 581. In some embodiments, phase delay plates 582, 583, and 584 are sequentially stacked on the first polarizing plate 585. For example, the first phase delay plate 582 can be interposed between the first polarizing plate 585 and the second polarizing plate 581. The second phase delay plate 583 can be interposed between the first polarizing plate 585 and the first phase delay plate 582. The third phase delay plate 584 can be interposed between the first polarizing plate 585 and the second phase delay plate 583.

The optical member 58 can further include an additional phase delay plate 587 disposed between the DBEF 586 and the OLED L1. Hereinafter, the additional phase delay plate 587 may be referred to as a fourth phase delay plate 587. However, the embodiments can employ any number of phase delay plates. Thus, the fourth phase delay plate 587 can be omitted if desired.

The first polarizing plate 585 and the second polarizing plate 581 respectively have a polarizing axis and linearly polarize light toward their polarization axis. The first polarizing plate 585 and the second polarizing plate 581 transmit light that matches the polarizing axis of each of the first and second polarizing plates 585 and 581, and absorbs light that does not match the polarizing axes. Thus, light passed through the first polarizing plate 585 and the second polarizing plate 581 are linearly-polarized along their polarizing axis directions.

The DBEF 586 also transmits light matching the polarizing axes and reflects light that significantly mismatches the polarizing axes. Therefore, the first polarizing plate 585 and the second polarizing plate 581 are different from the DBEF 586, because the first polarizing plate 585 and the second polarizing plate 581 absorb light that mismatches their polarizing axes.

In some embodiments, the DBEF 586 and the first polarizing plate 585 have polarization axes in the same direction. For example, the angle of intersection between the polarization axis of the first polarizing plate 585 and the polarization axis of the second polarizing plate 581 may be about 45 degrees.

The first phase delay plate 582 is a ½ wavelength plate, and the first phase delay plate 582 has a light axis that is turned by an angle ranging from about 17.5 degrees to about 27.5 degrees from the polarizing axis of the second polarizing plate 581. That is, an angle of intersection between the light axis of the first phase delay plate 582 and the polarizing axis of the second polarizing plate 581 may range from about 17.5 degrees to about 27.5 degrees. In addition, the angle of intersection between the light axis of the first phase delay plate 582 and the polarizing axis of the first polarizing plate 585 may range from about 17.5 degrees to about 27.5 degrees.

The second phase delay plate 583 is a ¼ wavelength plate, and has a light axis that is turned by an angle ranging from about 40 degrees to about 50 degrees from the polarizing axis of the second polarizing plate 581. That is, the angle of intersection between the light axis of the second phase delay plate 583 and the polarizing axis of the second polarizing plate 581 may range from about 40 degrees to about 50 degrees. In addition, an angle of intersection between the light axis of the second phase delay plate 583 and the polarizing axis of the first polarizing plate 585 may range from about 0 degrees to about 5 degrees.

The third phase delay plate 584 is a ¼ wavelength plate, and has a light axis that is turned by an angle ranging from about 85 degrees to about 95 degrees from the polarizing axis of the second polarizing plate 581. That is, an angle of intersection between the light axis of the third phase delay plate 584 and the polarizing axis of the second polarizing plate 581 may range from about 85 degrees to about 95 degrees. In addition, an angle of intersection between the light axis of the third phase delay plate 584 and the polarizing axis of the first polarizing plate 585 may range from about 40 degrees to about 50 degrees.

The fourth phase delay plate 587 is a ¼ wavelength plate, and has a light axis that is turned by an angle ranging from about 40 degrees to about 50 degrees from the polarizing axis of the DBEF 586.

Figure 2:
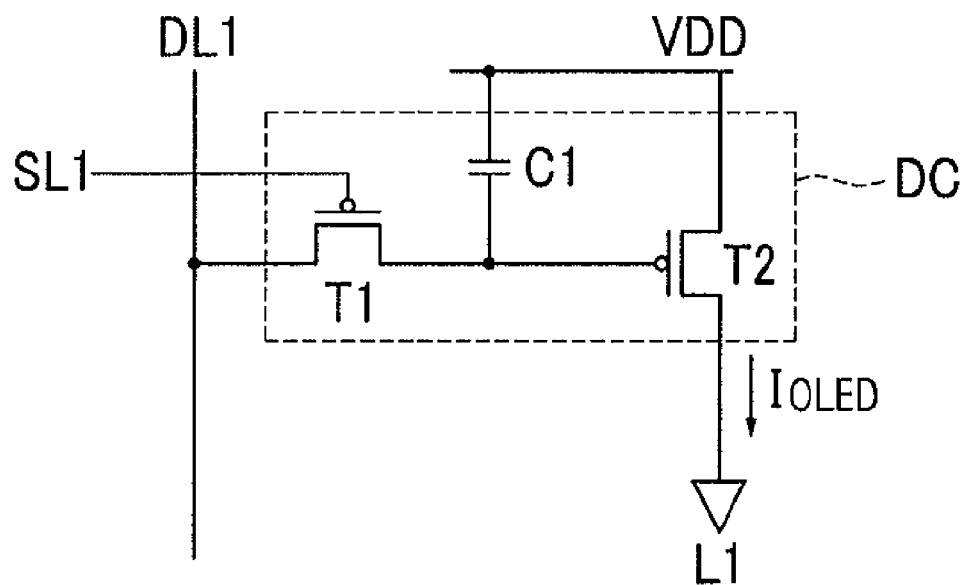
FIG. 2 is a layout view of a circuit layout of a driving circuit and an OLED of the OLED display of FIG. 1.

Referring now to FIG. 2, a driving circuit unit DC may include two or more thin film transistors T1 and T2 and at least one storage capacitor C1. Configurations of the driving circuit unit DC and the OLED L1 are not limited to the described embodiments. One skilled in the art will recognize that the embodiments can be variously modified.

As shown, the driving circuit unit DC may include a switching transistor T1 and a driving transistor T2. The switching transistor T1 is connected to a scan line SL1 and a data line DL1. The switching transistor T1 transmits a data voltage input from the data line DL1 according to a switching voltage input to the scan line SL1 to the driving transistor T2.

The storage capacitor C1 is connected to the switching transistor T1 and a power source line VDD. The capacitor C1 stores a voltage corresponding to a voltage difference of a voltage transmitted from the switching transistor T1 and a voltage supplied to the power source line VDD.

Referring now to FIG. 3 to FIG. 6, the manner in which the optical member 58 efficiently suppresses reflection of external light and minimizes loss of light emitted to the outside will be further described. The manner in which visible light passes through the optical member 58 will now be described.

As is well known, visible light can be classified according to wavelength bands or colors. For example, blue light has a wavelength range of approximately 420 nm to 480 nm. Green light has a wavelength range of about 550 nm, and red light has a wavelength of about 650 nm.

Since each color has a different wavelength, variations occur when the visible light passes through the optical member 58. Accordingly, the various light axes of the optical member 58 are set to have appropriate angles to compensate for colors included in the external light. This allows the optical member 58 to efficiently suppress reflection based on the conditions of light emitted from the OLED L1.

For illustrative purposes, an exemplary optical member 58 that is arranged to emit light generated from the OLED L1 with a minimum loss of blue light will now be discussed. Such an embodiment of the optical member 58 can be appropriate when luminance of blue light emitted from the OLED L1 is relatively low.

In general, the various colors or wavelengths of visible light will not behave substantially differently when passing through the optical member 58. Thus, the discussion of the behavior of blue light as an example can be generally illustrative of the embodiments. However, slight variations for the different wavelengths of light may be exhibited. For example, transmittance of the different wavelengths may vary when passing through the optical member 58.

Figure 3:
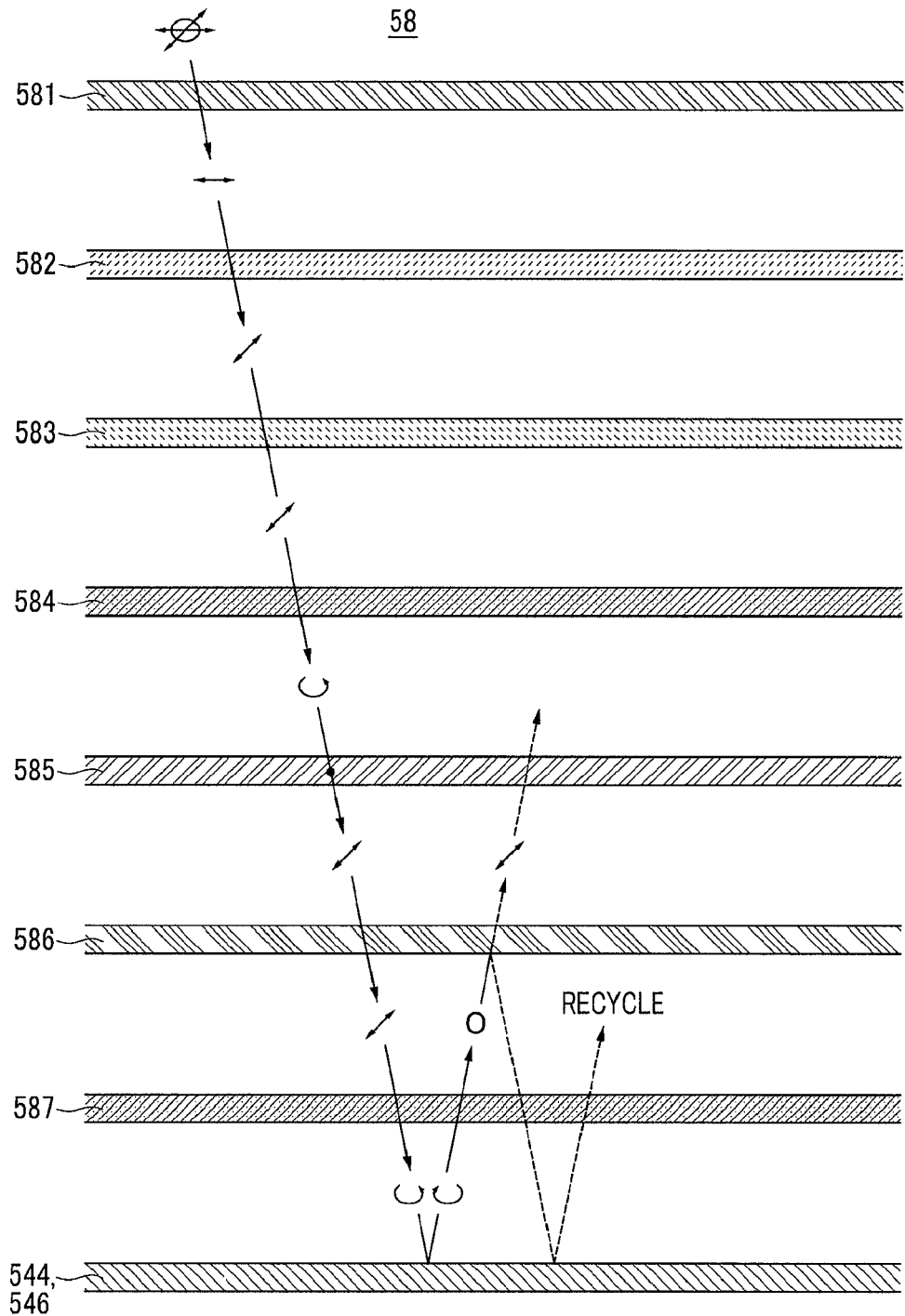
FIG. 3 and FIG. 4 are a cross-sectional view and a configuration diagram of a path for transmission of light from outside into the OLED display of FIG. 1.
Figure 4:
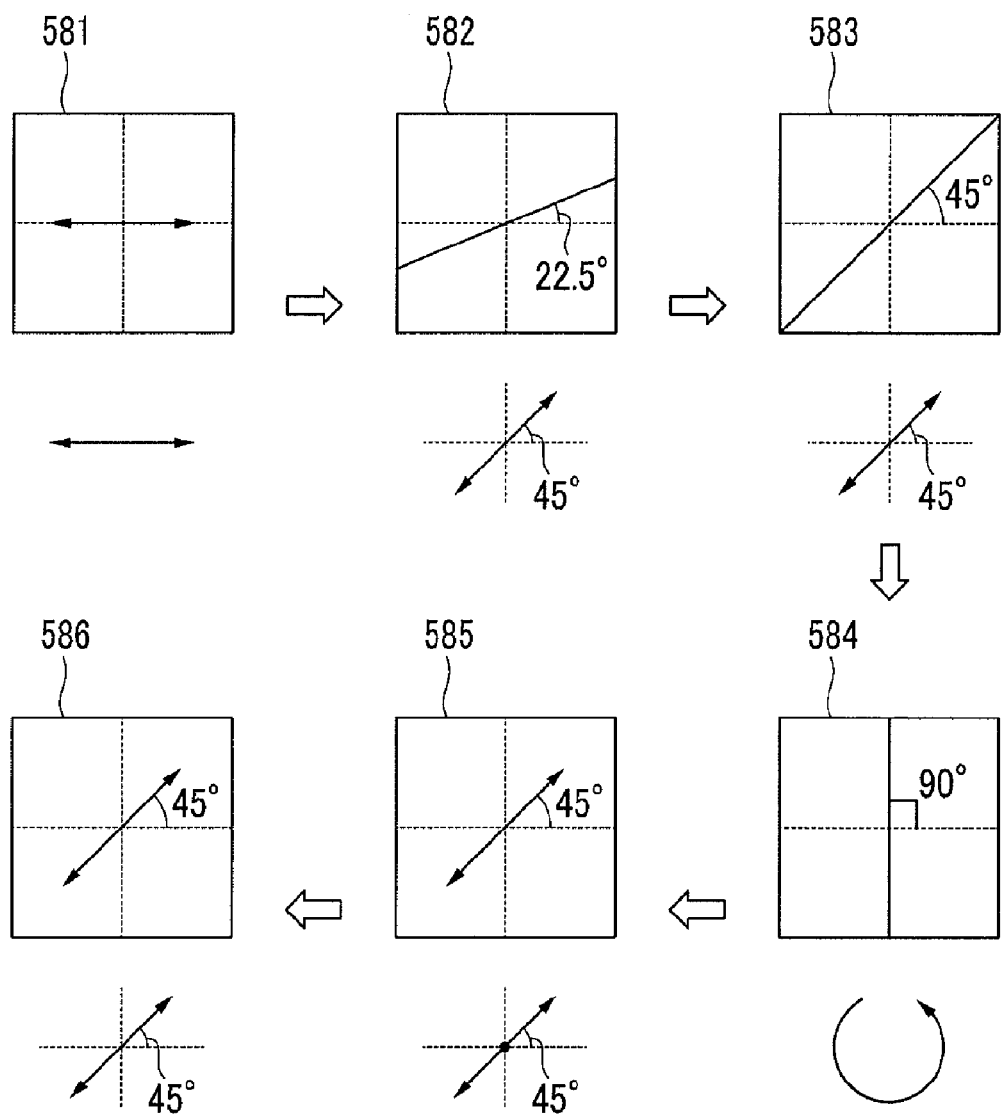

Reference will now be made to FIG. 3 and FIG. 4 to describe the inbound path of light transmitted into the optical member 58 from outside. External light initially includes a mixture of phases. However, most of the inbound light passing through the optical member 58 is absorbed or extinguished. Therefore, the OLED display 100 can efficiently suppress reflection of the external light and thereby improving visibility of the display.

As shown in FIG. 3, external inbound light passes through the second polarizing plate 581. As it passes through the second polarizing plate 581, the light is linearly polarized along the polarizing axis direction of the polarizing plate 581.

This linearly-polarized light then passes through the first phase delay plate 582. The first phase delay plate is the ½ wavelength plate. Relative to the second polarizing plate 581, the light axis of the first phase delay plate 582 is rotated by about 45 degrees. The first phase delay plate 582 also maintains the linearly-polarized state of the light passing through. The axis of light passing through the first phase delay plate 582 is turned by about 22.5 degrees from the polarizing axis of the second polarizing plate 581. That is, the angle of intersection between the light axis of the first phase delay plate 582 and the polarizing axis of the second polarizing plate 581 is about 22.5 degrees.

The inbound light next passes through the second phase delay plate 583. The second phase delay plate 583 is the ¼ wavelength plate. Relative to the second polarizing plate 581, the light axis of the second phase delay plate 583 is turned by about 45 degrees. Thus, the angle of intersection of the second phase delay plate 583 and the polarizing axis of the second polarizing plate 581 is about 45 degrees.

Since the light was rotated by about 45 degrees and was linearly-polarized after passing through the first phase delay plate 582, the inbound light is substantially equivalent to the light axis direction of the second phase delay plate 583. Accordingly, this light can pass through the second phase delay plate 583 without substantial loss. Here, the substantial equivalence implies that the visible light has several wavelengths for respective colors, and therefore, light axis directions of the entire light passed through the first phase delay plate 582 are not completely equivalent to each other.

The light that has passed through the second phase delay plate 583 is now rotated 45 degrees and is linearly polarized. Some of this light next passes through the third phase delay plate 584. Relative to the polarizing axis of the second polarizing plate 581, the light axis of the third phase delay plate 584 is turned by about 90 degrees. That is, the angle of intersection between the light axis of the third phase delay plate 584 and the polarizing axis of the second polarizing plate 581 is now about 90 degrees.

Since the angle of intersection between the axis direction of the 45-degree rotated and linearly-polarized light and the light axis direction of the third phase delay plate 584 is about 45 degrees, the light passing through the third phase delay plate 584 is circularly polarized. However, this light is also linearly-polarized along the polarizing axis direction of the first polarizing plate 585.

Light that passes through the first polarizing plate 585 is light that matches the polarizing axis of the first polarizing plate 585. But, light that does not match the polarizing axis of the first polarizing plate 585 is absorbed. Thus, some the circularly-polarized light may pass through the first polarizing plate 585, but most of the circularly-polarized light is absorbed in the first polarizing plate 585 and extinguished. This feature suppresses much of the reflection of external light.

The light that is linearly-polarized and passing through the first polarizing plate 585 may next pass through the DBEF 586 without substantial loss. This light is reflected to electrodes 544 and 546 of the OLED L1 after passing through the fourth phase delay plate 587. In addition, the light can be reflected to other metal wires. This light path will be further described later with reference to FIG. 5 and FIG. 6 since it is essentially the same light path as outbound light from the OLED L1 to the outside.

Figure 5:
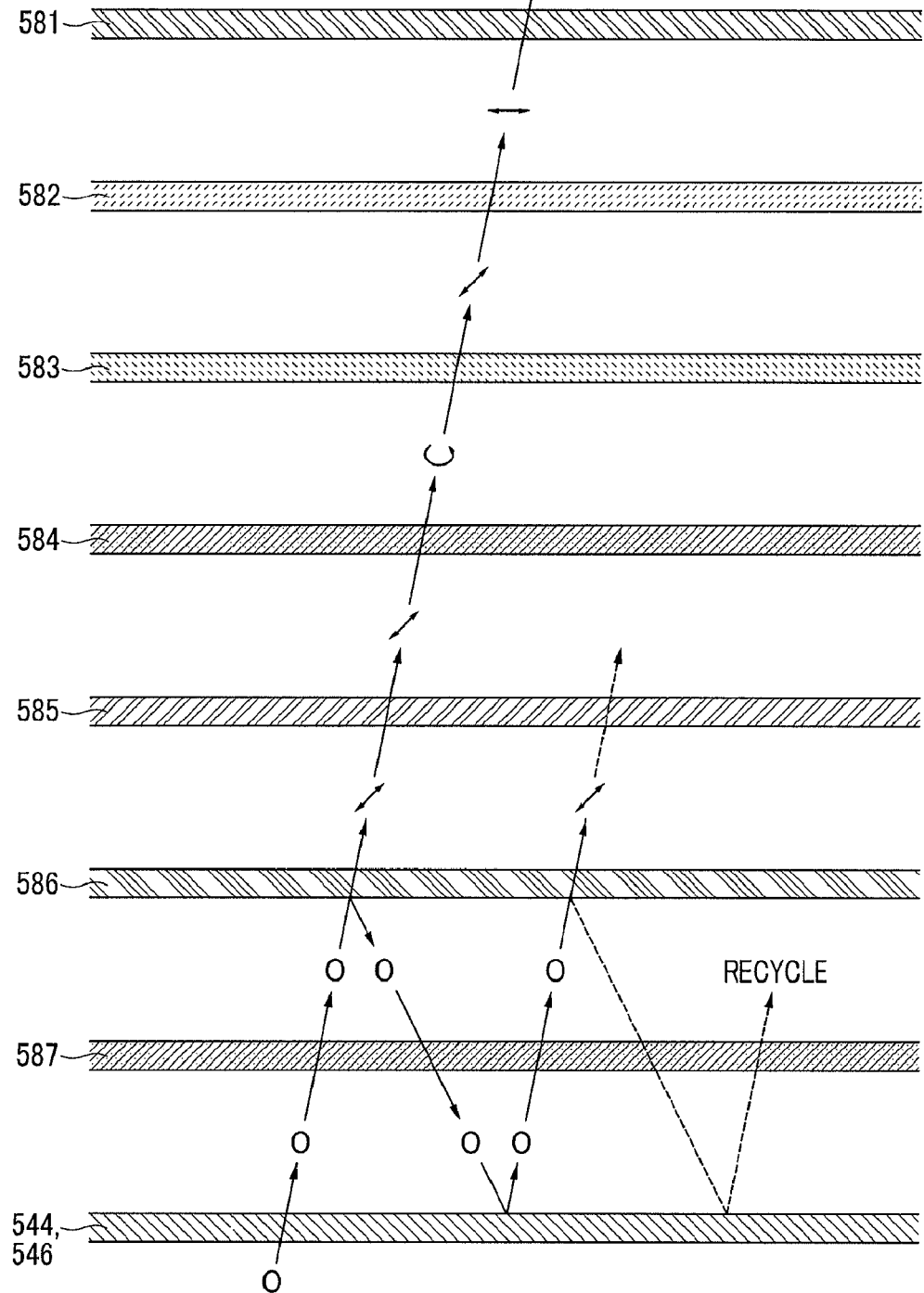
FIG. 5 and FIG. 6 are a cross-sectional view and a configuration diagram of a path for emission of light generated from an OLED of the OLED display of FIG. 1 to the outside.
Figure 6:
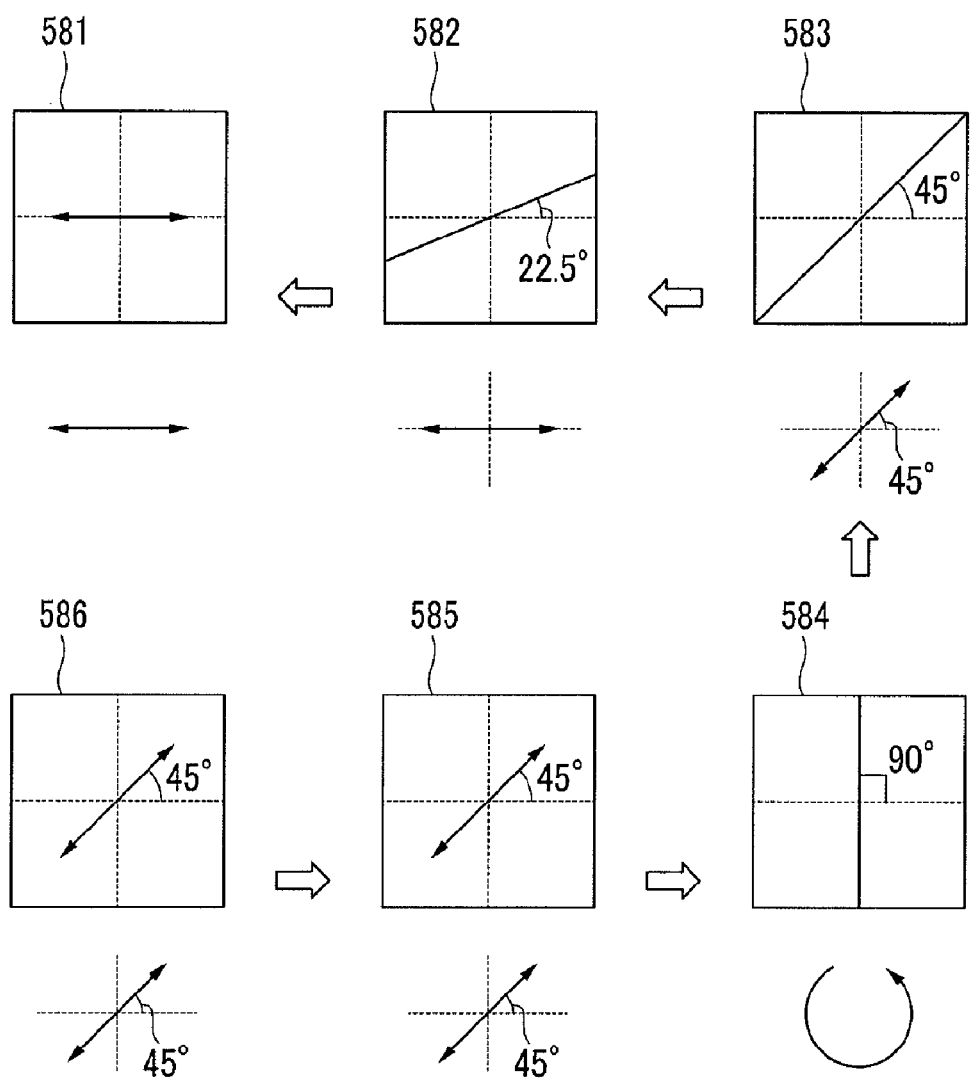

The path for outbound light emitted from the organic emission layer 545 to the outside will now be described with reference to FIG. 5 and FIG. 6. Initially, light emitted from the organic emission layer 545 sequentially passes through the second electrode 546 and the fourth phase delay plate 587. At this time, the light includes a mixture of various phases.

The light that is passed through the fourth phase delay plate 587 is transmitted to the DBEF 586. The light matching the polarizing axis of the DBEF 586 passes through and is also linearly polarized. Meanwhile, light mismatching the polarizing axis of the DBEF 586 is reflected back to the fourth phase delay plate 587.

The light reflected from the DBEF 586 passes through the fourth phase delay plate 587 and may be reflected again by the electrodes 544 and 546 of the OLED L1. Accordingly, some of the light reflected from the DBEF 586 is linearly-polarized and the rest of the light is continuously re-reflected. This process may recycle several times between the DBEF 586 and the electrodes 544 and 546 of the OLED L1. Eventually, most of the light emitted from the OLED L1 is linearly polarized and passes through the DBEF 586.

The outbound light next reaches the first polarizing plate 585. As noted above, the fourth phase delay plate 587 changes the phase of the light when the light recycles between the DBEF 586 and the electrodes 544 and 546 of the OLED L1 in order to help the light more efficiently pass through the DBEF 586. Thus, the light that is passed through the DBEF 586 is linearly-polarized and can pass through the first polarizing plate 585 without substantial loss. This is because the polarizing plate of the DBEF 586 is the same configuration as that of the first polarizing plate 585.

The light next passes through the third phase delay plate 584, which is the ¼ wavelength plate. Relative to the first polarizing plate 585, the light axis of the third phase delay plate 584 is turned by about 45 degrees. Thus, the angle of intersection between the light axis of the third phase delay plate 584 and the polarizing axis of the first polarizing plate 585 is about 45 degrees. Accordingly, since the angle of intersection between the light axis direction of the light that is passed through the first polarizing plate 585 and linearly polarized and the light axis direction of the third phase delay plate 584 is 45 degrees, the linearly-polarized light is circularly polarized while passing through the third phase delay plate 584.

The light next reaches the second phase delay plate 583, which is the ¼ wavelength plate. The light axis of the second phase delay plate 583 is equivalent to the polarizing axis of the first polarizing plate 585. Therefore, the light that is circularly-polarized while passing through the third phase delay plate 584 is linearly polarized while passing through the second phase delay plate 583 as in the linearly-polarized state before passing through the third phase delay plate 584. That is, the light that is linearly polarized while passing through the first polarizing plate 585 and the light linearly polarized while passing through the second phase delay plate 583 are substantially equivalent to each other.

The light that is linearly polarized while passing through the second phase delay plate 583 passes through the first phase delay plate 582 which is the ½ wavelength plate and rotates by 45 degrees while maintaining the linearly-polarized state. In this case, the light axis of the first phase delay plate 582 is turned by 22.5 degrees from the polarizing axis of the first polarizing plate 585. That is, the angle of intersection between the light axis of the first phase delay plate 582 and the polarizing axis of the first polarizing plate 585 is 22.5 degrees.

In addition, the axis direction of the linearly-polarized light that is rotated by 45 degrees while passing through the first phase delay plate 582 is substantially equivalent to the polarizing axis direction of the second polarizing plate 581. Therefore, the 45-degree rotated linearly-polarized light is passed through the second polarizing plate without any substantial loss and emitted to the outside.

By the above-described configuration, the light emitted from the OLED L1 is mostly passed through the optical member 58 without significant loss and emitted to the outside. In the case of a conventional structure in which one polarizing plate and one phase delay plate are arranged, 40% of light emitted from an OLED L1 is emitted to the outside. On the other hand, in the case of the OLED display 100 according to the first exemplary embodiment of the present invention, it is experimentally proven that 80% of the light generated from the OLED L1 is passed through the optical member 58 and efficiently emitted to the outside. Accordingly, loss of outbound light emitted from the organic emission layer 545 to the outside can be minimized. In addition, the OLED display 100 can efficiently emit light generated from the organic emission layer 545 to the outside so that power consumption can be reduced and life-span can be increased.

Figure 7:
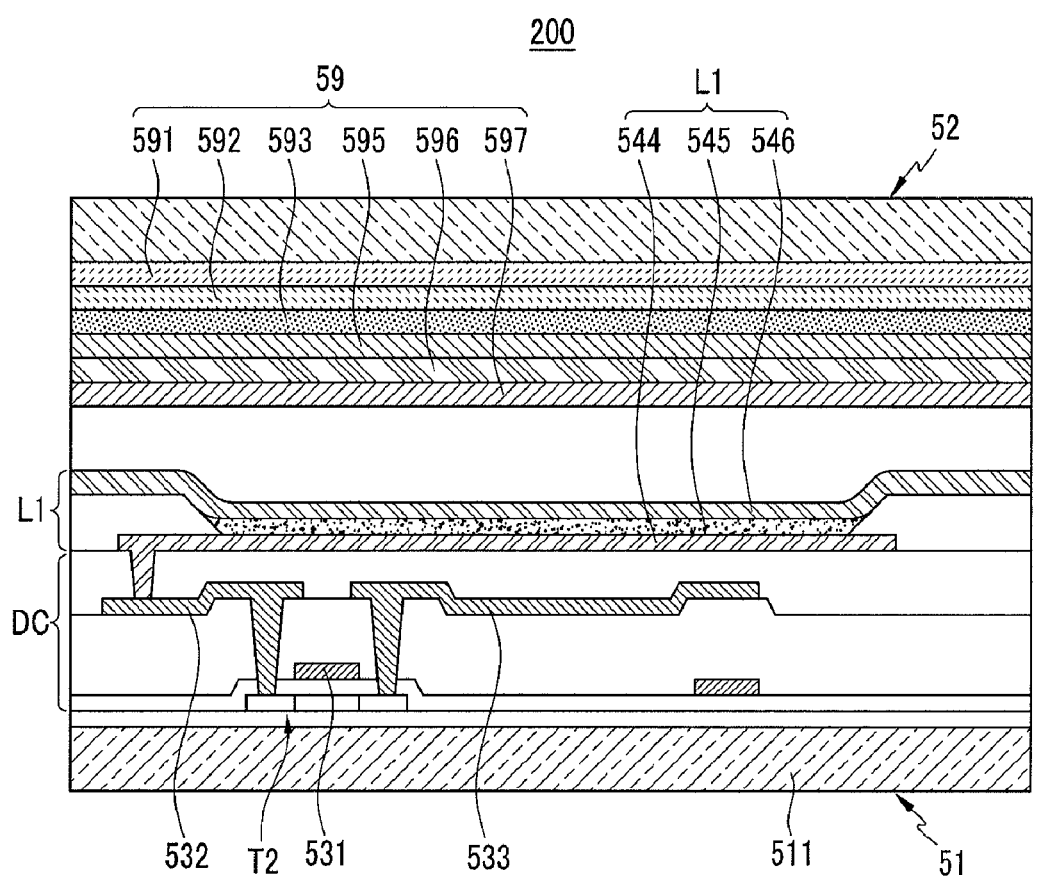
FIG. 7 is a cross-sectional view of an OLED display according to a second exemplary embodiment of the present invention.

A second exemplary embodiment of the present invention will now be described with reference to FIG. 7. As shown in FIG. 7, an OLED display 200 includes a first substrate 51, a second substrate 52, and an optical member 59. The first and second substrates 51 and 52 are bonded to each other. The optical member 59 includes a second polarizing plate 591, a plurality of phase delay plates 592 and 593, a first polarizing plate 595, and a DBEF 596.

The DBEF 596 is disposed on an OLED L1. The first polarizing plate 595 is disposed on the DBEF 596, and the second polarizing plate 591 is disposed on the first polarizing plate 595.

The plurality of phase delay plates 592 and 593 are interposed between the first polarizing plate 595 and the second polarizing plate 591. The first phase delay plate 592 is interposed between the first and second polarizing plates 595 and 591. The second phase delay plate 593 is interposed between the first polarizing plate 595 and the first phase delay plate 592. That is, the second phase delay plate 593 and the first phase delay plate 592 are sequentially stacked on the first polarizing plate 595.

In an embodiment, the optical member 59 can further include an additional phase delay plate 597 disposed interposed between the DBEF 596 and the OLED L1. Hereinafter, the additional phase delay plate will be referred to as a third phase delay plate 597. However, embodiments of the present invention are not limited to a specific number or configuration of phase delay plates. For example, the third phase delay plate 597 can be omitted as desired, for example, to reduce manufacturing costs.

The DBEF 596 and the first polarizing plate 595 have polarizing axes with the same direction. In addition, an angle of intersection between the polarizing axis of the first polarizing plate 595 and the polarizing axis of the second polarizing plate 591 is about 45°.

The first phase delay plate 592 is a ½ wavelength plate, and has a light axis turned by an angle ranging from about 10 degrees to about 20 degrees from the polarizing axis of the second polarizing plate 591. That is, the angle of intersection between the light axis of the first phase delay plate 592 and the polarizing axis of the second polarizing plate 591 may range from about 10 degrees to 20 degrees. In addition, the angle of intersection between the light axis of the first phase delay plate 592 and the polarizing axis of the first polarizing plate 595 may range from about 25 degrees to 35 degrees.

The second phase delay plate 593 is a ¼ wavelength plate and has a light axis that is turned by an angle ranging from about 70 degrees to 80 degrees from the polarizing axis of the second polarizing plate 591. That is, the angle of intersection between the light axis of the second phase delay plate 593 and the polarizing axis of the second polarizing plate 591 may range from about 70 degrees to about 80 degrees. In addition, the angle of intersection between the light axis of the second phase delay plate 593 and the polarizing axis of the first polarizing plate 595 may range from about 25 degrees to 35 degrees.

The third phase delay plate 597 is a ¼ wavelength plate and has a light axis that is turned by an angle range ranging from about 40 degrees to 50 about degrees from the polarizing axis of the DBEF 596.

With the above-described configuration, the OLED display 200 can improve visibility by effectively suppressing reflection of external light while minimizing loss of light emitted out from the organic emission layer 545. In addition, the OLED display 200 can reduce power consumption and extend life-span by efficiently emitting light generated from the organic emission layer 545. Thus, the display characteristics of the OLED display 200 can be improved.

The manner in which the optical member 59 of the OLED display 100 can minimize loss of light emitted out from the organic emission layer 545 while efficiently suppressing reflection of external light will now be described with reference to FIG. 8 to FIG. 11. For purposes of illustration, the optical member 59 described herein is arranged to minimize the loss of blue light in emission of light from an OLED L1. However, one skilled in the art will recognize that this is merely an exemplary description and that optical member 59 can be arranged differently.

The following example regarding blue light can be illustrative because other colors of visible light will not behave significantly differently from blue light. In other words, behavior of other colors of visible light will be substantially the same as that of the blue light when passing the optical member 59. However, the behavior of other colors of visible light can be slightly different due to differences in wavelength. Thus, transmittance of the other colors of visible light may be decreased when passing through an exemplary optical member 59.

Figure 8:
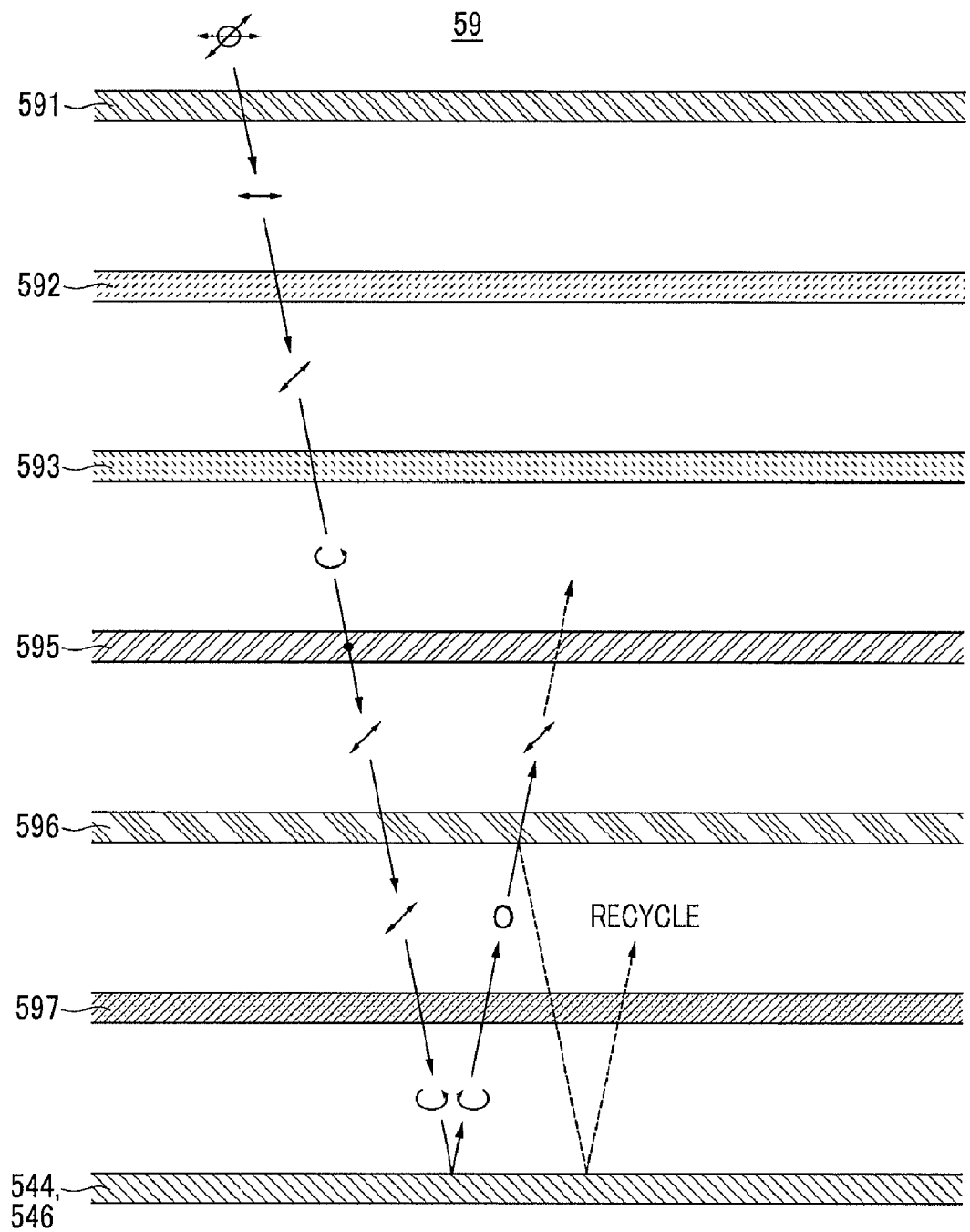
FIG. 8 and FIG. 9 are a cross-sectional view and a configuration diagram of a path for transmission of light from outside into the OLED display of FIG. 7.
Figure 9:
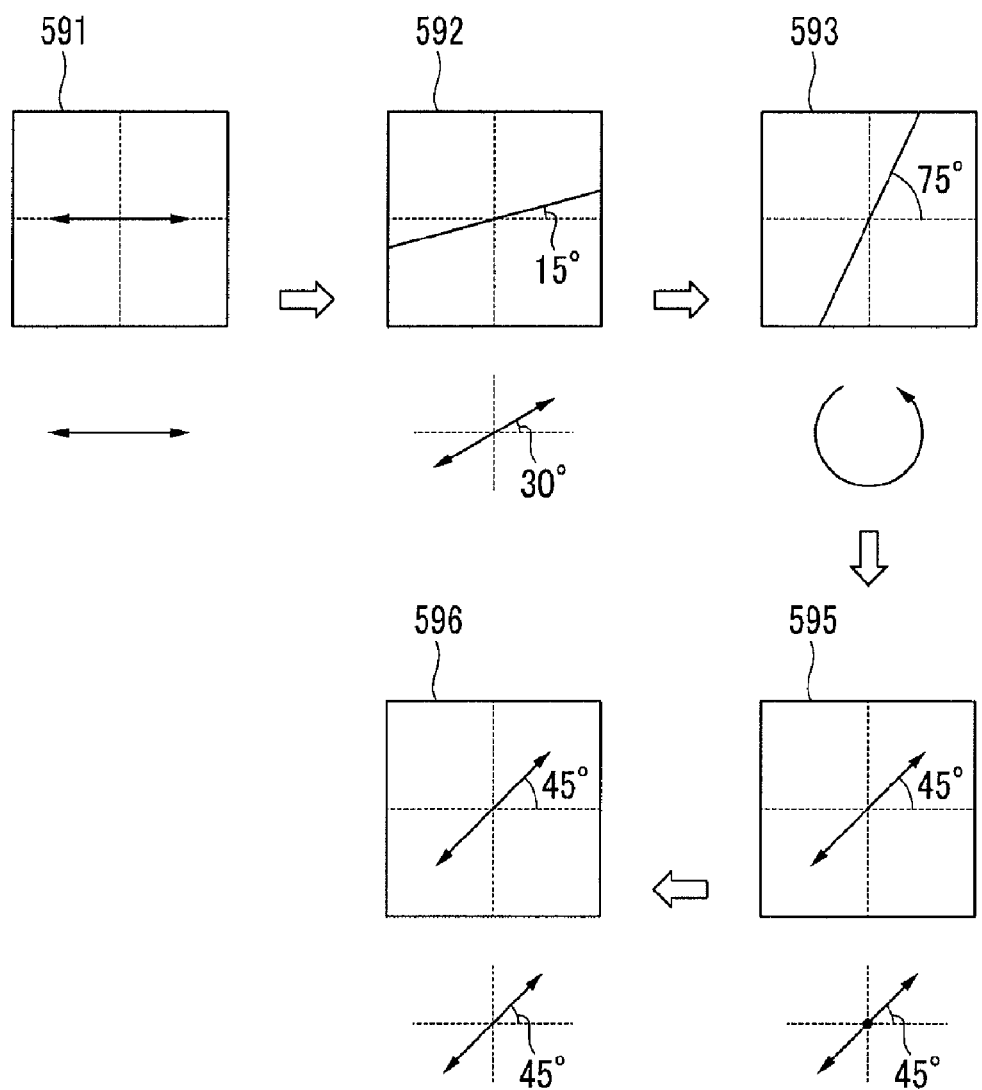

An inbound light path from outside to inside through the optical member 59 will now be described with reference to FIG. 8 and FIG. 9. External light from the outside may include a mixture of phases. As light passes through the second polarizing plate 591, the external light is linearly polarized.

Next, this linearly polarized light passes through the first phase delay plate 592 which is the ½ wavelength plate. The light is rotated by about 30 degrees while maintaining its linearly polarized state. The light axis of the first phase delay plate 592 is turned by about 15 degrees from the polarizing axis of the second polarizing plate 591. That is, the angle of intersection between the light axis of the first phase delay plate 592 and the polarizing axis of the second polarizing plate 591 is about 15 degrees.

Next, the light passes through the second phase delay plate 593, which is the ¼ wavelength plate. The light axis of the second phase delay plate 593 is turned by about 75 degrees from the polarizing axis of the second polarizing plate 591. That is, the angle of intersection between the light axis of the second phase delay plate 593 and the polarizing axis of the second polarizing plate 591 is about 75 degrees. The angle of intersection between the axis direction of the 30-degree rotated and linearly-polarized light and a light axis direction of the second phase delay plate 593 is about 45 degrees. While passing through the second phase delay plate 593, the linearly-polarized light is circularly-polarized.

Next, the light is linearly polarized along a polarizing axis direction of the first polarizing plate 595 while passing through the polarizing plate 595. The light that passes through the first polarizing plate 595 matches the polarizing axis of the first polarizing plate 595. Light that does not match the polarizing axis of the first polarizing plate 595 is absorbed or extinguished. Thus, some of the circularly-polarized light passes through the first polarizing plate 595. However, much of the circularly-polarized light is absorbed in the first polarizing plate 595 and extinguished. Since most of the circularly-polarized light is extinguished while passing through the first polarizing plate 595, the OLED display 100 effectively suppresses reflection of external light.

The light that is linearly-polarized while passing through the first polarizing plate 595 is passed through the DBEF 596 without substantial loss and may be reflected to electrodes 544 and 546 of the OLED L1 after passing through the third phase delay plate 597. In addition, the light can be reflected to other metal wires. This light path will be further described later with reference to FIG. 10 and FIG. 11 since it is essentially the same light path as outbound light from the OLED L1 to the outside.

With the above-described configuration, inbound light transmitted from outside is mostly suppressed or extinguished by the optical member 59 in the first polarizing plate 595. Therefore, the OLED display 200 can improve visibility by efficiently suppressing reflection of the external light.

Figure 10:
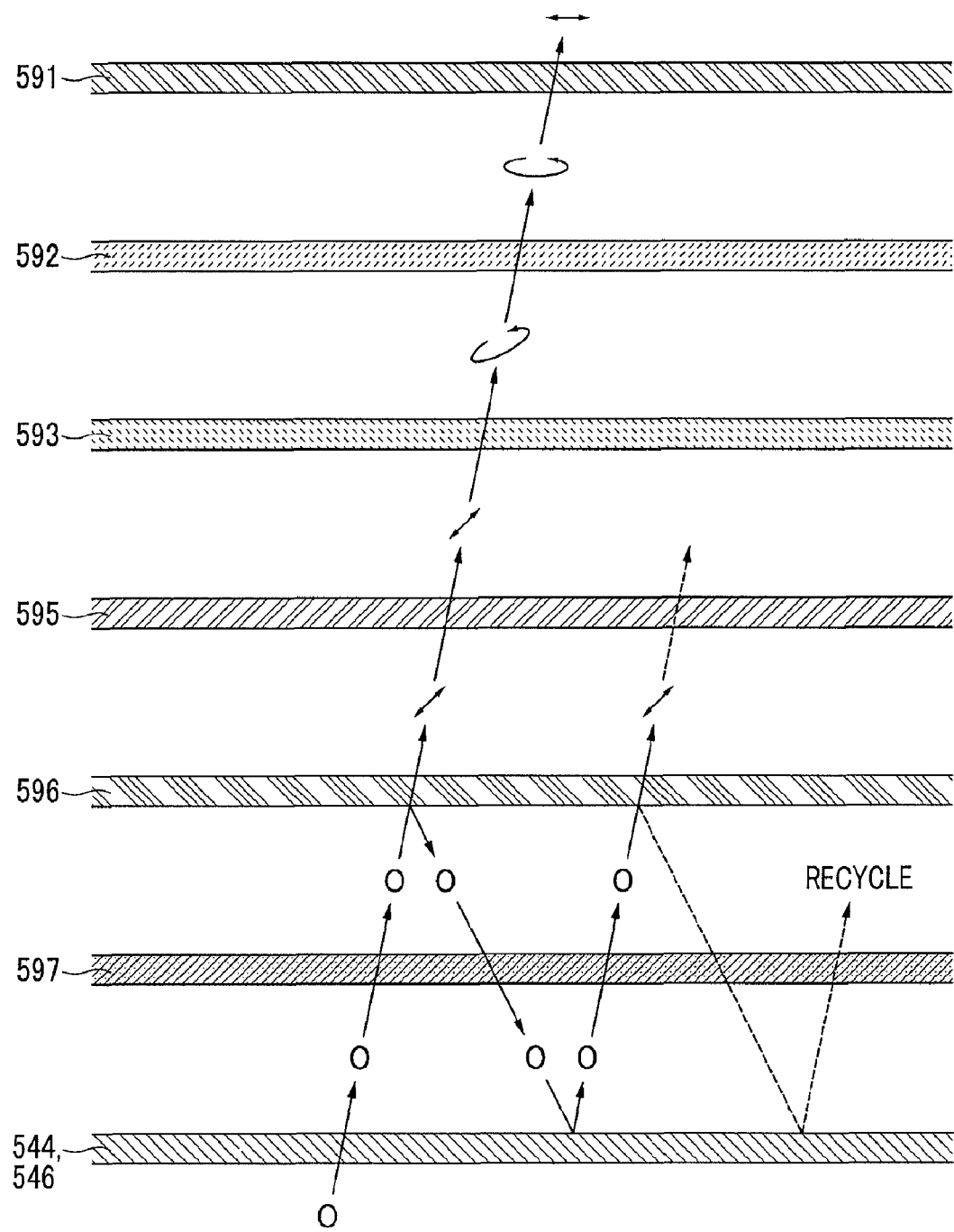
FIG. 10 and FIG. 11 are a cross-sectional view and a configuration diagram of a path for emission of light generated from an OLED of the OLED display of FIG. 7 to the outside.
Figure 11:
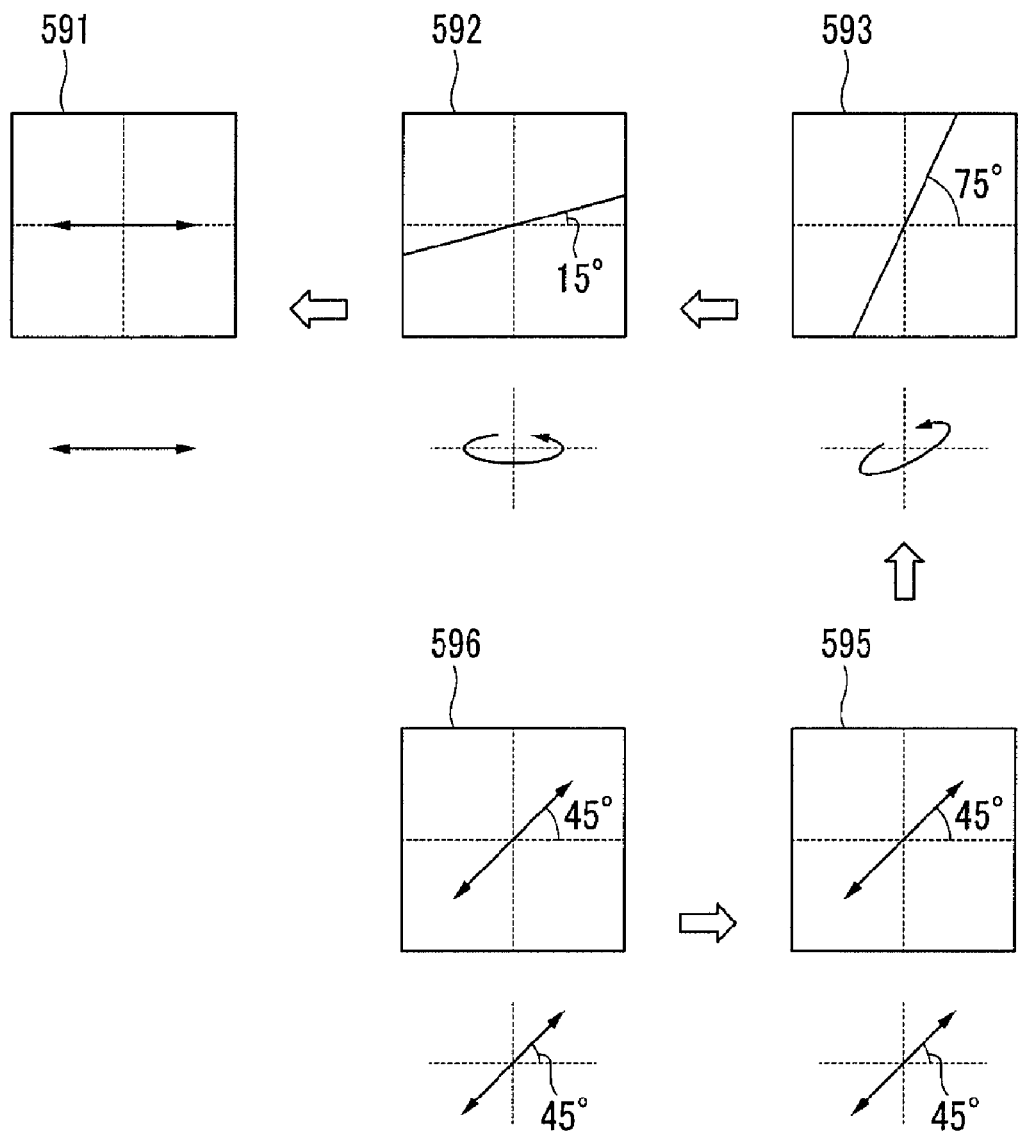

An outbound light path from the organic emission layer 545 of FIG. 7 will now be described with reference to FIG. 10 and FIG. 11. Light emitted from the organic emission layer 545 sequentially passes through the second electrode 546 and the third phase delay plate 597. The light initially includes a mixture of various phases.

The light that is passed through the third phase delay plate 597 is transmitted toward the DBEF 596. The light matching the polarizing axis of the DBEF 596 passes through the third phase delay plate 597 and is also linearly polarized. Meanwhile, light that does not match the polarizing axis of the DBEF 596 is reflected back to the third phase delay plate 597.

The light reflected from the DBEF 596 passes through the third phase delay plate 597 and may be reflected again by the electrodes 544 and 546. Accordingly, some of the light reflected from the DBEF 596 is linearly polarized and the rest of the light is continuously re-reflected. This process may recycle sever times between the DBEF 596 and the electrodes 544 and 546. Eventually, most of the light emitted from the OLED L1 is linearly polarized and passes through the third phase delay plate. Therefore, the fourth phase delay plate 597 effectively changes the phase of the light when the light recycles between the DBEF 596 and the electrodes 544 and 546 and can help the light more efficiently pass through the DBEF 596.

The light that is passed through the DBEF 596 and linearly-polarized is next passes through the first polarizing plate 595 without any substantial loss. This is because the polarizing plate of the DBEF 596 matches the polarization the first polarizing plate 595.

The linearly-polarized light then passes through the second phase delay plate 593 and is elliptically polarized. The second phase delay plate 593 is the ¼ wavelength plate. The light axis of the second phase delay plate 593 is turned by about 30 degrees from the polarizing axis of the first polarizing plate 595. That is, the angle of intersection between the light axis of the second phase delay plate 593 and the polarizing axis of the first polarizing plate 595 is about 30 degrees.

Since the angle of intersection between an axis direction of the linearly-polarized light passed through the first polarizing plate 595 and a light axis direction of the second phase delay plate 593 becomes 30 degrees, the linearly-polarized light is elliptically polarized while passing through the second phase delay plate 593. The linearly-polarized light can be circularly polarized when the angle of intersection between the axis direction of the linearly-polarized light and the light axis of the second phase delay plate 593 is about 45 degrees. Therefore, the linearly-polarized light is elliptically polarized since the angle of intersection therebetween is about 30 degrees.

The light next passes through the first phase delay plate 592, which is the ½ wavelength plate and rotates by about 15 degrees while maintaining the elliptically-polarized state of the light. The light axis of the first phase delay plate 592 is turned by about 30 degrees from the polarizing axis of the first polarizing plate 595. That is, the angle of intersection between the light axis of the first phase delay plate 592 and the polarizing axis of the first polarizing plate 595 is about 30 degrees.

In addition, the longer axis direction of the elliptically-polarized light that is rotated by 15 degrees while passing through the first phase delay plate 592 is substantially equivalent to the polarizing axis direction of the second polarizing plate 591. Therefore, most of the light is passed through the second polarizing plate 591 and emitted to the outside even though it is in the elliptically-polarized state rather than a linearly-polarized state.

With the above-described configuration, the light generated from the OLED L1 can pass through the optical member 59 and can be efficiently emitted to the outside. Therefore, the loss of light emitted to the outside from the organic emission layer 545 can be minimized. In addition, the OLED display 200 can efficiently emit light generated from the organic emission layer 545 to the outside so that power consumption can be reduced and life-span can be increased.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
    an OLED formed by sequentially stacking a first electrode, an organic emission layer, and a second electrode;
    a dual brightness enhancement film (DBEF) formed on the OLED;
    a first polarizing plate formed on the DBEF;
    a second polarizing plate formed on the first polarizing plate; and
    a plurality of phase delay plates formed between the first polarizing plate and the second polarizing plate.

2. The OLED display of claim 1, wherein the first polarizing plate and the DBEF have the same polarizing axis.

3. The OLED display of claim 2, wherein an angle of intersection between the polarizing axis of the first polarizing plate and a polarizing axis of the second polarizing plate is about 45 degrees.

4. The OLED display of claim 3, wherein the plurality of phase delay plates comprise a first phase delay plate which is a ½ wavelength plate interposed between the first polarizing plate and the second polarizing plate, a second phase delay plate which is a ¼ wavelength plate interposed between the first polarizing plate and the first phase delay plate, and a third phase delay plate which is a ¼ wavelength plate interposed between the first polarizing plate and the second phase delay plate.

5. The OLED display of claim 4, wherein an angle of intersection between the polarizing axis of the second polarizing plate and a light axis of the first phase delay plate may range from about 17.5 degrees to 27.5 degrees, and an angle of intersection between the polarizing axis of the first polarizing plate and the light axis of the first phase delay plate is within the range of 17.5 degrees to 27.5 degrees.

6. The OLED display of claim 5, wherein an angle of intersection between the polarizing axis of the second polarizing plate and the light axis of the second phase delay plate may range from about 40 degrees to 50 degrees, and an angle of intersection between the polarizing axis of the first polarizing plate and the light axis of the second phase delay plate may range from about 0 degrees to 5 degrees.

7. The OLED display of claim 6, wherein an angle of intersection between the polarizing axis of the second polarizing plate and a light axis of the third phase delay plate may range from about 85 degrees to 90 degrees, and an angle of intersection between the polarizing axis of the first polarizing plate and the light axis of the third phase delay plate may range from about 40 degrees to 50 degrees.

8. The OLED display of claim 7, wherein an angle of intersection between the light axis of the second phase delay plate and the light axis of the third phase delay plate is 45 degrees.

9. The OLED display of claim 3, wherein the plurality of phase delay plates comprise a first phase delay plate which is a ½ wavelength plate interposed between the first polarizing plate, and the second polarizing plate and a second phase delay plate which is a ¼ wavelength plate interposed between the first polarizing plate and the first phase delay plate.

10. The OLED display of claim 9, wherein an angle of intersection between the polarizing axis of the second polarizing plate and the light axis of the first phase delay plate may range from about 10 degrees to 20 degrees, and an angle of intersection between the polarizing axis of the first polarizing plate and the light axis of the first phase delay plate may range from about 25 degrees to 35 degrees.

11. The OLED display of claim 10, wherein an angle of intersection between the polarizing axis of the second polarizing plate and the light axis of the second phase delay plate may range from about 70 degrees to 80 degrees, and an angle of intersection between the polarizing axis of the first polarizing plate and the light axis of the second phase delay plate may range from about 25 degrees to 35 degrees.

12. The OLED display of claim 1, further comprising an additional phase delay plate interposed between the OLED and the DBEF.

13. The OLED display of claim 12, wherein an angle of intersection between a light axis of the additional phase delay plate and the polarizing axis of the DBEF may range from about 40 degrees to 50 degrees.

14. The OLED display of claim 4, further comprising an additional phase delay plate interposed between the OLED and the DBEF.

15. The OLED display of claim 14, wherein an angle of intersection between a light axis of the additional phase delay plate and the polarizing axis of the DBEF may range from about 40 degrees to 50 degrees.

16. The OLED display of claim 9, further comprising an additional phase delay plate interposed between the OLED and the DBEF.

17. The OLED display of claim 16, wherein an angle of intersection between a light axis of the additional phase delay plate and the polarizing axis of the DBEF may range from about 40 degrees to 50 degrees.

* * * * *